(12) United States Patent  
Walmsley

(10) Patent No.: US 8,661,901 B2  
(45) Date of Patent: Mar. 4, 2014

(54) THREE PHASE CAPACITANCE-BASED SENSING

(75) Inventor: Robert G. Walmsley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 296 days.

(21) Appl. No.: 13/257,386

(22) PCT Filed: Mar. 19, 2009

(86) PCT No.: PCT/US2009/037648  
§ 371 (c)(1),  
(2), (4) Date: Sep. 19, 2011

(87) PCT Pub. No.: WO2010/107436  
PCT Pub. Date: Sep. 23, 2010

(65) Prior Publication Data  
US 2012/0085169 A1 Apr. 12, 2012

(51) Int. Cl.  
*G01P 15/125* (2006.01)  
*G01C 15/08* (2006.01)

(52) U.S. Cl.  
USPC .................................. 73/514.32; 73/514.18

(58) Field of Classification Search  
USPC ............... 73/514.32, 514.16, 514.29, 514.36, 73/514.38, 514.01, 514.17, 514.18  
See application file for complete search history.

(56) References Cited

U.S. PATENT DOCUMENTS

| | | | |
|---|---|---|---|
| 4,336,718 A | 6/1982 | Washburn | |
| 4,420,754 A * | 12/1983 | Andermo | 324/660 |
| 4,743,902 A * | 5/1988 | Andermo | 324/660 |
| 5,205,171 A | 4/1993 | O'Brien et al. | |
| 5,447,067 A | 9/1995 | Biebl et al. | |
| 5,534,859 A | 7/1996 | Meyer | |
| 5,646,348 A | 7/1997 | Greiff et al. | |
| 5,672,949 A | 9/1997 | Ward | |
| 5,719,336 A | 2/1998 | Ando et al. | |

(Continued)

FOREIGN PATENT DOCUMENTS

| | | |
|---|---|---|
| CN | 1836168 | 9/2006 |
| CN | 101135561 | 3/2008 |

(Continued)

OTHER PUBLICATIONS

Supplementary European Search Report, Aug. 1, 2012, EP Patent Application No. 09842006.0, Hewlett-Packard Development Company, L.P.

(Continued)

*Primary Examiner* — Helen Kwok

(57) ABSTRACT

Various systems and methods for sensing are provided. In one embodiment, a sensing system is provided that includes a first electrode array disposed on a proof mass, and a second electrode array disposed on a planar surface of a support structure. The proof mass is attached to the support structure via a compliant coupling such that the first electrode array is positioned substantially parallel to and faces the second electrode array and the proof mass is capable of displacement relative to the support structure. The first electrode array includes a plurality of first patterns of electrodes and the second electrode array includes a plurality of second patterns of electrodes. The sensing system further includes circuitry configured to provide an input voltage to each of the second patterns of electrodes to produce an electrical null position for the first electrode array.

15 Claims, 10 Drawing Sheets

(56) References Cited

U.S. PATENT DOCUMENTS

| | | | |
|---|---|---|---|
| 5,894,091 A | 4/1999 | Kubota | |
| 6,032,531 A | 3/2000 | Roszhart | |
| 6,041,653 A * | 3/2000 | Ichikawa et al. | 73/514.32 |
| 6,223,598 B1 | 5/2001 | Judy | |
| 6,257,057 B1 | 7/2001 | Hulsing, II | |
| 6,591,678 B2 | 7/2003 | Sakai | |
| 6,657,444 B2 | 12/2003 | Fasen | |
| 7,036,374 B2 * | 5/2006 | Pike et al. | 73/514.32 |
| 7,119,550 B2 | 10/2006 | Kitano et al. | |
| 7,142,500 B2 | 11/2006 | Fasen et al. | |
| 7,343,801 B2 | 3/2008 | Kapser et al. | |
| 7,484,411 B2 | 2/2009 | Walmsley | |
| 2005/0097959 A1 | 5/2005 | Pike et al. | |
| 2008/0178674 A1 | 7/2008 | Walmsley | |

FOREIGN PATENT DOCUMENTS

| | | |
|---|---|---|
| EP | 0749002 | 12/1996 |
| GB | 2009944 | 6/1979 |
| JP | 1994-034654 | 2/1994 |
| JP | 1996-062245 | 3/1996 |
| JP | 1996-313551 | 11/1996 |
| JP | 1997-292410 | 11/1997 |
| JP | 2002-048813 | 2/2002 |
| JP | 2008-102091 | 5/2008 |
| WO | WO-2009013666 | 1/2009 |

OTHER PUBLICATIONS

English translation (machine-generated) of Abstract in Japanese Patent Publication JP-1994-034654.

English translation (machine-generated) of Abstract in Japanese Patent Publication JP-1996-062245.

English translation (machine-generated) of Abstract in Japanese Patent Publication JP-1996-313551.

English translation (machine-generated) of Abstract in Japanese Patent Publication JP-1997-292410.

English translation (machine-generated) of Abstract in Japanese Patent Publication JP-2002-048813.

English translation (machine-generated) of Abstract in Japanese Patent Publication JP-2008-102091.

* cited by examiner

THREE PHASE CAPACITANCE-BASED SENSING

BACKGROUND

The sensing of position and acceleration using capacitive Micro Electro-Mechanical Systems (MEMS) can lack sensitivity and accuracy due to unwanted movement of compliant components and due to the limited range of motion of such components. In addition, the dynamic range (i.e., ratio of largest to smallest signal) of a sensor can be limited by the method used to convert capacitance change to either position or acceleration.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
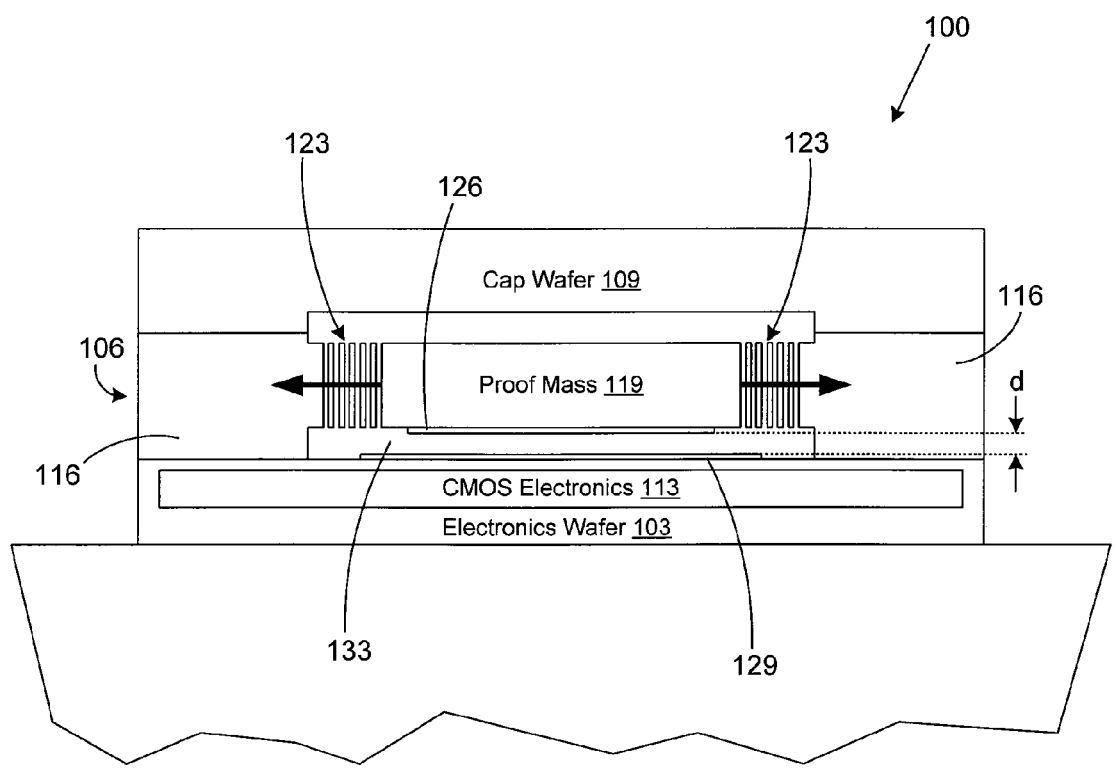
FIG. 1 is a diagram of a sensor according to an embodiment of the present invention.

With reference to FIG. 1, shown is a sensor 100 according to an embodiment of the present invention. The sensor 100 may be employed, for example, to detect acceleration, as will be described. The sensor 100 includes three layers, or "wafers." In particular, the sensor 100 includes an electronics wafer 103, a proof mass wafer 106, and a cap wafer 109. Within the electronics wafer 100 is CMOS electronics 113 that may be electrically coupled to various electrical components in the proof mass wafer 106 and the cap wafer 109. Also, the CMOS electronics 113 may provide output ports for coupling to electronic components external to the sensor 100 as can be appreciated. For certain applications, heat generated in the CMOS electronics 113 may be unacceptable in which case they may be located in a separate but proximal electronics die, etc.

The proof mass wafer 106 includes a support 116 that is mechanically coupled to a proof mass 119. Although the cross-sectional view of the sensor 100 is shown, according to one embodiment, the support 116 as a portion of the proof mass wafer 106 surrounds the proof mass 119. Consequently, in one embodiment, the electronics wafer 103, the support 116, and the cap wafer 109 form a pocket within which the proof mass 119 is suspended.

Together, the electronics wafer 103, the support 116, and the cap wafer 109 provide a support structure to which the proof mass 119 is attached via a compliant coupling according to various embodiments of the present invention. In this respect, the compliant coupling may comprise high aspect ratio flexural suspension elements 123. The high aspect ratio flexural suspension elements 123 may be those that are discussed, for example, in U.S. Pat. No. 6,882,019 entitled "Moveable Micro-Electromechanical Device" issued on Apr. 19, 2005.

The sensor 100 further includes a first electrode array 126 that is disposed on the proof mass 119. In one embodiment, the first electrode array 126 is located on a surface of the proof mass 119 that is opposite the upper surface of the electronics wafer 103. The surface of the proof mass 119 upon which the first electrode array 126 is disposed is a substantially flat surface as can be appreciated.

A second electrode array 129 is disposed on a surface of the electronics wafer 103 facing opposite the first electrode array 126 disposed on the proof mass 119. Due to the manner in which the proof mass 126 is suspended over the electronics wafer 103, a substantially uniform gap 133 is formed between the first electrode array 126 and the second electrode array 129. The size of the gap 133 is denoted by distance d. The distance d may comprise, for example, anywhere from 1 to 3 micrometers, or it may be any other distance as is deemed appropriate.

The proof mass 119 is suspended above the electronics wafer 103 in such a manner that the first electrode array 126 and the second electrode array 129 substantially fall into planes that are parallel to each other, such that the gap 133 is substantially uniform throughout the entire overlap between the first and second electrode arrays 126 and 129. Alternatively, the electrode arrays 126, 129 may be placed on other surfaces or structures of the electronics wafer 103 or the proof mass 119, as may be deemed appropriate.

The high aspect ratio flexural suspension elements 123 offer a degree of compliance that allows the proof mass 119 to move relative to the support structure of the sensor 100. Due to the design of the flexural suspension elements 123, the displacement of the proof mass 119 from a rest position is substantially restricted to a direction that is substantially parallel to the second electrode array 129, which is disposed on the upper surface of the electronics wafer 103. The flexural suspension elements 123 are configured to allow for a predefined amount of movement of the proof mass 119 in a direction parallel to the second electrode array 129 such that the gap 133 remains substantially uniform throughout the entire motion to the extent possible. The design of the flexural suspension elements 123 provides for a minimum amount of motion of the proof mass 119 in a direction orthogonal to the second electrode array 129, while allowing a desired amount of motion in the direction parallel to the second electrode array 129.

Next, a brief discussion of the operation of the sensor 100 in sensing acceleration, for example, is provided. In particular, the sensor 100 is affixed to a structure or vehicle that experiences acceleration that one wishes to quantify. The sensor 100 is affixed to the structure or device such that the direction of the acceleration is in line with the direction of the permitted movement of the proof mass 119 as provided by the flexural suspension elements 123 as discussed above. Once the structure or vehicle experiences acceleration, the proof mass 119 will move as described above. Due to the fact that the first electrode array 126 and the second electrode array 129 are disposed on the proof mass 119 and the electronics wafer 103, then one or more capacitances between the first and second electrode arrays 126 and 129 will vary with the shifting of the arrays with respect to each other.

The CMOS electronics 113 and/or external electronics may be employed to detect or sense the degree of the change in the capacitances between the electrode arrays 126 and 129. Based upon the change in the capacitances, such circuitry can generate appropriate signals that are proportional to the acceleration experienced by the sensor 100. Alternatively, a closed loop circuit may be employed to maintain the proof mass 119 at a predefined location during acceleration. Such a circuit comprises a closed loop that applies actuation signals to cause the proof mass 119 to stay at the predefined location based upon position feedback from the first and second electrode arrays 126 and 129 as will be described.

While motion of the proof mass 119 is substantially restricted within a plane that is substantially parallel to the second electrode array 129, given that the flexural suspension elements 123 are compliant in nature, then it is possible that the proof mass 119 might experience displacement relative to the second electrode array 129 in a direction orthogonal to the second electrode array 129. Stated another way, unwanted movement of the proof mass 119 may occur resulting in an undesirable change in the gap 133. The accurate capacitive sensing of in-plane motion is substantially immune to undesired out-of-plane motion that changes the gap 133 for the methods described herein.

Figure 2:
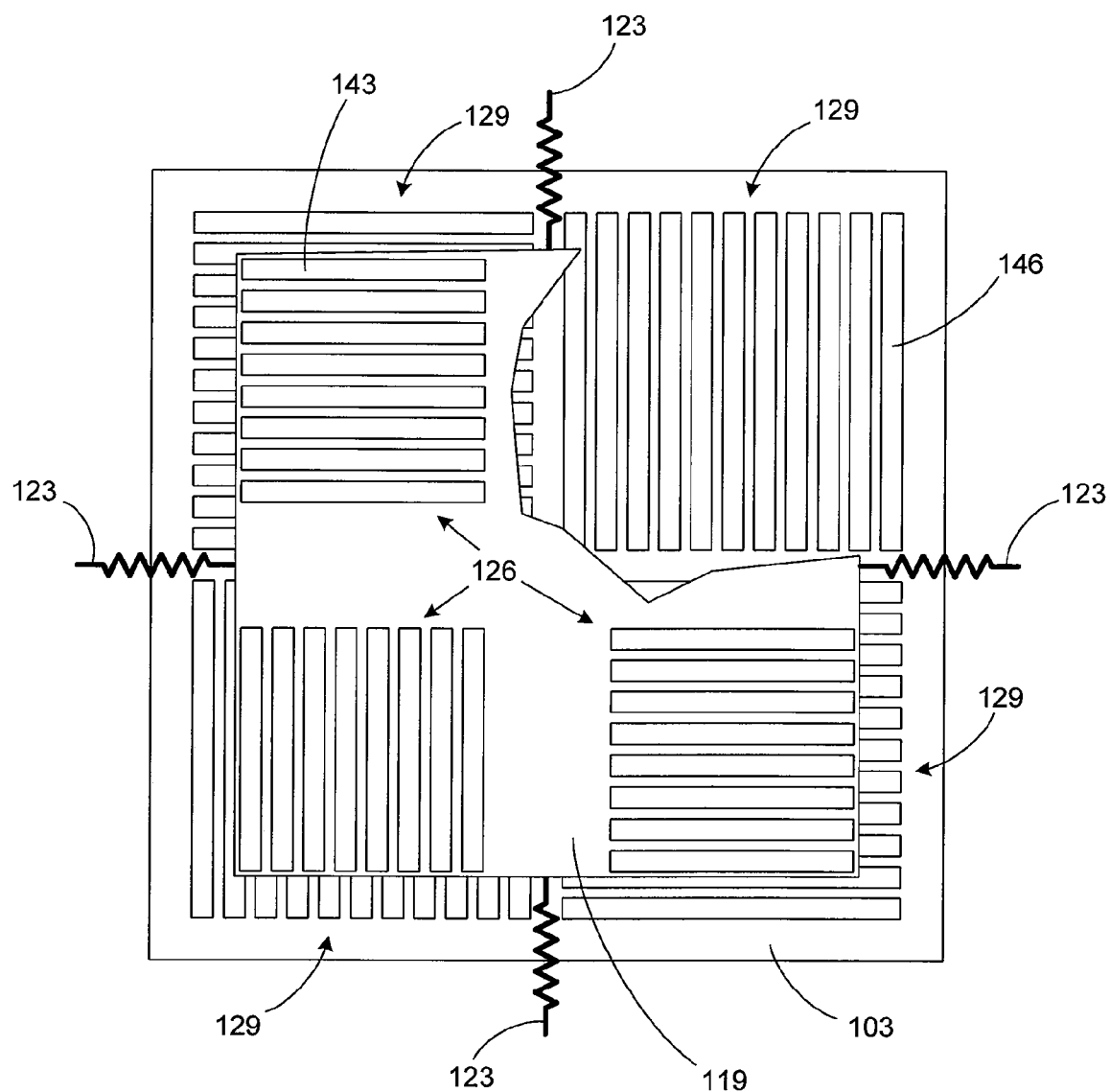
FIG. 2 is a drawing of electrode arrays employed in the sensor of FIG. 1 according to an embodiment of the present invention.

Next, with reference to FIG. 2, shown are views of the respective first and second electrode arrays 126 and 129 according to an embodiment of the present invention. As shown, there are actually multiple first electrode arrays 126 and multiple second electrode arrays 129. For example, in the configuration shown, there may be four pairs of first and second electrode arrays 126 and 129. Given that the first and second electrode arrays 126 and 129 are oriented as shown in FIG. 2, the movement of the proof mass 119 in two dimensions within a plane that is parallel to the second electrode array 129 may be sensed. Accordingly, in one embodiment, the flexural suspension elements 123 are configured to allow movement of the proof mass 119 in two dimensions. Alternatively, the flexural suspension elements may be configured to allow movement in a single dimension, where the first and second electrode arrays 129 and 129 are situated in a single orientation to sense such single dimensional movement.

Each individual electrode array comprises a plurality of electrodes. In particular, the first electrode arrays 126 are each made up of a plurality of first electrodes 143 and the second electrode arrays 129 are made up of a plurality of second electrodes 146. For each of the first electrode arrays 126, there is a corresponding second electrode array 129. Each of the first electrode arrays 126 is smaller in size than the corresponding second electrode array 129 to account for the fact that the first electrode arrays 126 are moveable. Consequently, even though the first electrode arrays 126 move relative to the respective second electrode arrays 126, there is always substantially similar overlap between the respective pairs of first and second electrode arrays 126 throughout the entire range of motion of the proof mass 119.

Each of the first and second electrodes 143 and 146 comprise rectangular conductors that are disposed adjacent to each other. The distance between a common point in each of the electrodes 143 and 146 for a respective electrode array is called the "pitch" of the electrode array. Although the electrodes 143 and 146 are shown as rectangular conductors, it is understood that conductors of other shapes and sizes may be employed as desired in connection with the principles described herein. Also, electrodes may be disposed in configurations other than in rectangular arrays as depicted. For example, the electrodes may be disposed in a circular array for use in detecting angular acceleration and displacement as can be appreciated.

Figure 3:
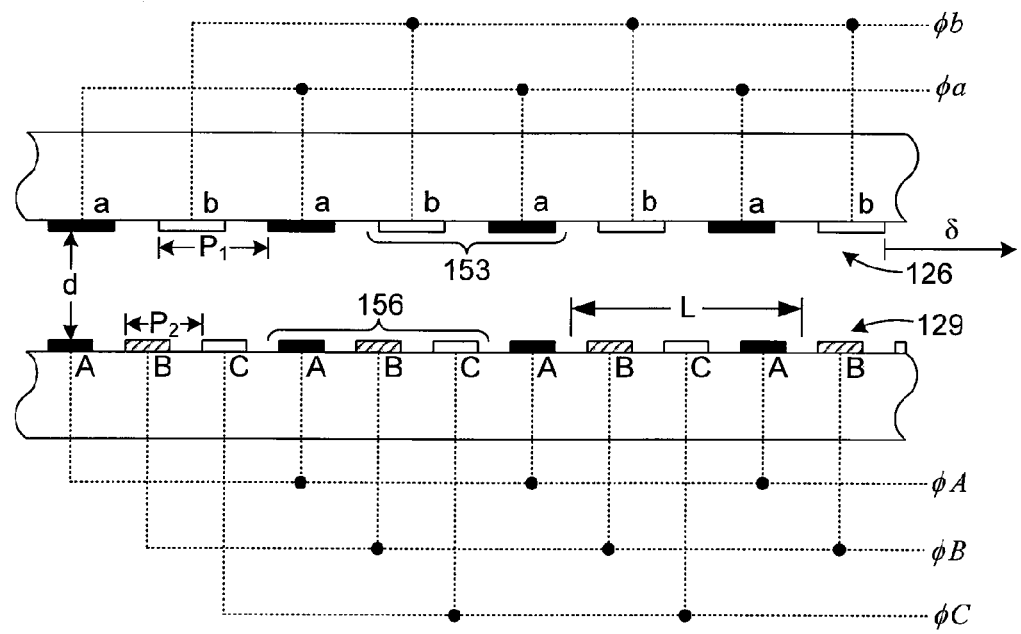
FIG. 3 is a is a schematic of the electrical coupling between corresponding electrodes in the sensor of FIG. 1 according to an embodiment of the present invention.

Turning then to FIG. 3, shown is a side view of portions of the first and second electrode arrays 26 and 129. In addition, the electrical connections between respective ones of the electrodes 143 and 146 in the respective electrode arrays 126 or 129 are depicted. In view of the electrical connections, the first electrode array 126 includes a plurality of first patterns 153 of the electrodes 143. Each pattern 153 includes two of the electrodes 143. Each electrode 143 within each pattern 153 corresponds with other electrodes 143 in other patterns 153 that occupy the same position in their respective patterns 143. That is to say, a first one of the electrodes 143 within a first one of the first patterns 153 corresponds to a second one of the electrodes 143 in a second one of the first patterns 153 when both such electrodes 143 occupy the same location within their respective patterns 153. The corresponding electrodes 143 in each of the patterns 153 are electrically coupled to each other. Also, the first patterns 153 are interdigitated with respect to each other within the first electrode array 126.

The second electrode array 129 comprises a plurality of second patterns 156 of the electrodes 146. Each of the second patterns 156 comprises at least three second electrodes 146. Each electrode 146 within each pattern 156 corresponds with other electrodes 146 in other patterns 156 that occupy the same position in their respective patterns 146. That is to say, a first one of the electrodes 146 within a first one of the second patterns 156 corresponds to a second one of the electrodes 146 in a second one of the second patterns 156 when both such electrodes 146 occupy the same location within their respective patterns 156. The second patterns 156 are interdigitated within the second electrode array 129. The corresponding ones of the second electrodes 146 in each of the second patterns 156 are coupled in common.

Each of the electrodes 143 and 146 are evenly spaced within the first and second electrode arrays 126 and 129. In this respect, the first electrode array 126 has a pitch $P_1$, where the pitch $P_1$ is the distance between a point on a given electrode within the first electrode array 126 and the same point on the next an adjacent electrode. Similarly, the second electrode array 129 has a pitch $P_2$. In the context of one embodiment of the sensor 100, the first and second electrode arrays 126 and 129 have a group length L, where $L=2P_1=3P_2$.

According to an embodiment of the present invention, the pitches $P_1$ and $P_2$ of the first and second electrode arrays 126 and 129 are specified such that a ratio of a pitch $P_1$ of the first electrode array 126 to the pitch $P_2$ of the second electrode array 129 is substantially equal to 1.5.

The commonly coupled electrodes 143 of the first electrode array 126 form either the first phase $\theta_a$ or a second phase $\theta_b$. Similarly, the electrodes 146 that are commonly coupled form phases $\theta_A$, $\theta_B$, and $\theta_C$, as shown. This configuration results in phases of second electrode array 129 being separated by 120 degrees.

Figure 4:
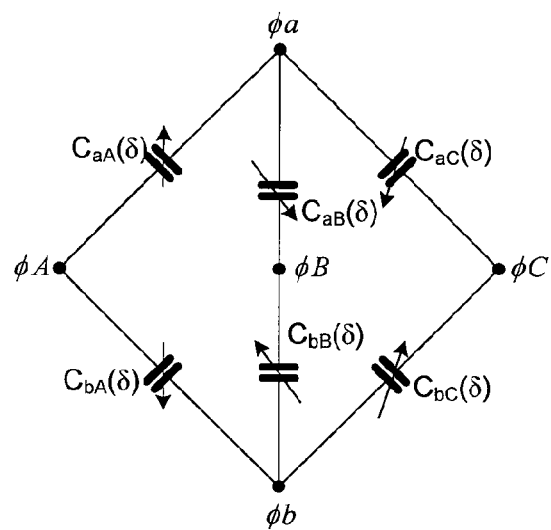
FIG. 4 is a schematic of an equivalent circuit showing the cross-capacitances between first and second electrode arrays in the sensor of FIG. 1 according to an embodiment of the present invention.

Referring next to FIG. 4, shown is an equivalent circuit that shows the cross-capacitance terms between the first electrode array 126 and the second electrode array 129 as a function of displacement $\delta$ of the first electrode array 126 relative to the second electrode array 129. Although not shown, it is understood that other constant and variable capacitances associated with the first and second electrode arrays 126 and 129 including parasitic capacitances may exist that are not taken into account in the schematic of FIG. 4. While the capacitances shown in FIG. 4 vary with the relative position of the two electrode arrays 126 and 129, it is understood that the parasitic capacitances that are not shown may not experience significant variation or may be constant.

Figure 5:
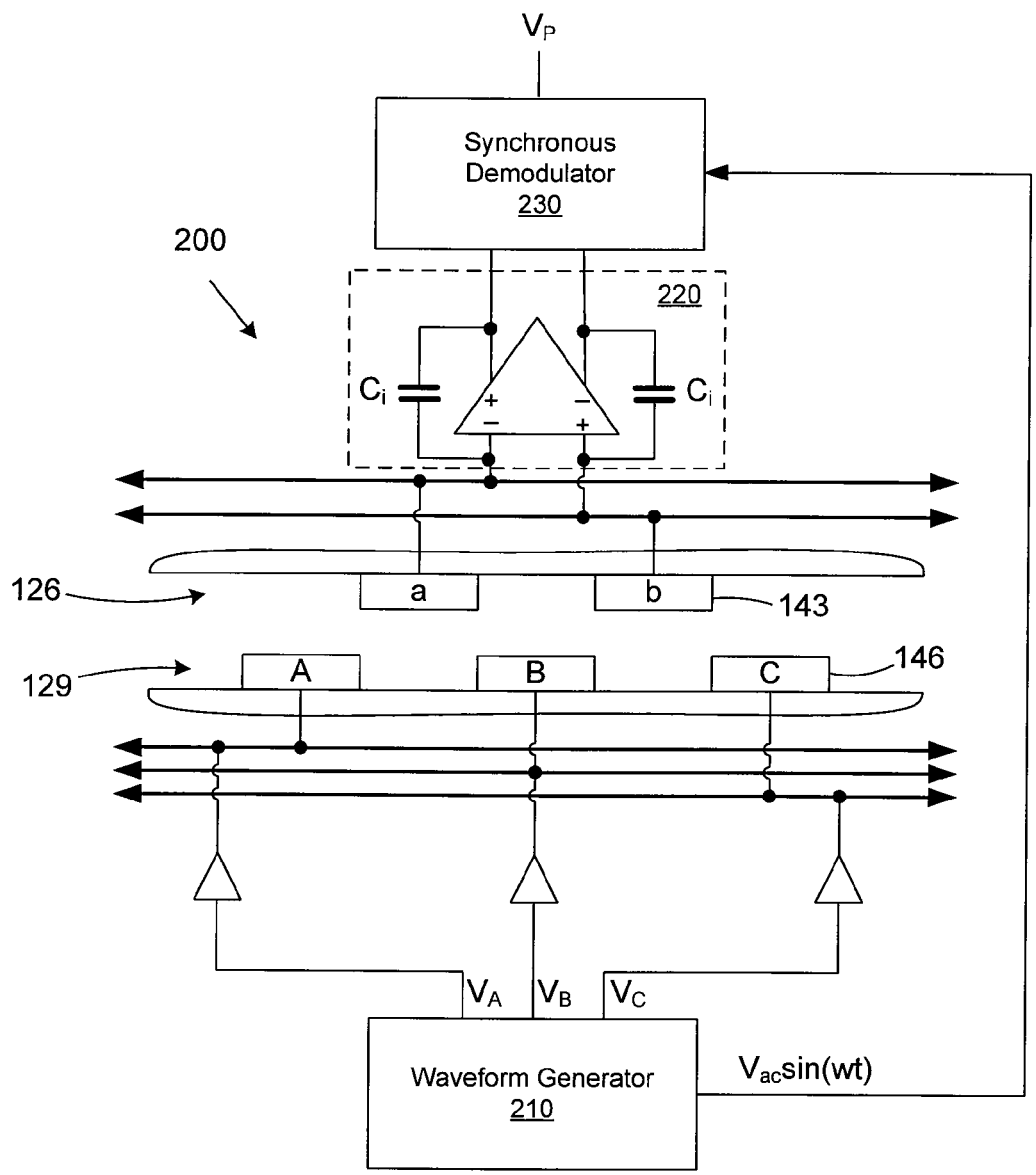
FIG. 5 is a schematic of a sensor as depicted in FIG. 1 embodied to produce a demodulated output voltage according to an embodiment of the present invention.

Referring next to FIG. 5, shown is a schematic of a three phase sensor 200 that provides one example of the sensor 100 (FIG. 1) according to an embodiment of the present invention. The three phase sensor 200 includes the first electrode array 126 (two electrodes depicted) that illustrates a single pattern 153 (FIG. 3). In addition, the three phase sensor 200 includes the second electrode array 129 (three electrodes depicted) that illustrates a single pattern 156 (FIG. 3). The sensor 200 includes a waveform generator 210 for supplying voltages $V_A$, $V_B$, and $V_C$, which are sinusoidal voltages applied to the commonly coupled electrodes 146 of the second electrode array 129. In one embodiment, the voltages $V_A$, $V_B$, and $V_C$ are scaled versions of a single reference voltage $V_{ac} \sin(\omega t)$, where $\omega$ is the angular excitation frequency ($2\pi f_c$). The frequency of the AC voltage source $V_{ac} \sin(\omega t)$ is specified so as to be substantially higher than either a closed loop bandwidth or any system mechanical responses. In one embodiment, voltages $V_A$, $V_B$, and $V_C$ may be produced from a common voltage source through respective digitally controlled divider networks such as, but not limited to, an R2R Ratio DAC (see e.g., FIG. 10). While the embodiment of FIG. 5 illustrates using sinusoidal voltages, other periodic wave forms may also be utilized.

Each of the commonly coupled electrodes 143 in the first electrode array 126 are coupled to a differential integrator 220. The three phase sensor 200 is configured to generate a demodulated output voltage $V_p$ based upon the phase-to-phase capacitance between the first electrode array 126 and the second electrode array 129. The cross-capacitance between the first electrode array 126 and the second electrode array 129 results in signals at the first electrodes 143 that are applied to the differential integrator 220. The outputs of the differential integrator 220 are coupled to an input of a respective synchronous demodulator 230. In addition, the reference voltage $V_{ac} \sin(\omega t)$ is supplied to the synchronous demodulator 230 by the waveform generator 210.

Under conditions of AC excitation, the amplitude of the sinusoidal signals entering the synchronous demodulator 230 vary with the changes in capacitance as the electrode arrays 126 and 129 move relative to each other. The synchronous demodulator 230 produces the demodulated output voltage $V_p$ based on the differential integrator 220 outputs and the reference voltage.

In order to obtain a maximum change in the cross-capacitances per change in position (dC/dx), the ratio of the pitch of the first electrode array 126 to the gap d between the first and second electrode arrays 126 and 129 is specified to be substantially equal to 1.6, or stated another way, $P_1/d \approx 1.6$. In this regime, the variation in the cross-capacitance may be adequately represented by a single component Fourier expansion with a period equal to the group length L. However, it should be understood that other values may be employed for the ratio of the pitch of the first electrode array to the gap d. For $P_1/d$ ratios in the range of about 1 to 5, the cross-capacitance terms between electrode arrays 126 and 129 for the three phases A, B, and C may be represented by:

$$C_{aA}(d,\delta,L,A_r) = C_s(d,L,A_r)\sin(2\pi\delta/L + 2\pi/3) + C_0(d,L,A_r), \quad (1)$$

$$C_{aB}(d,\delta,L,A_r) = C_s(d,L,A_r)\sin(2\pi\delta/L + 5\pi/3) + C_0(d,L,A_r), \quad (2)$$

$$C_{aC}(d,\delta,L,A_r) = C_s(d,L,A_r)\sin(2\pi\delta/L) + C_0(d,L,A_r), \quad (3)$$

$$C_{bA}(d,\delta,L,A_r) = C_s(d,L,A_r)\sin(2\pi\delta/L + \pi) + C_0(d,L,A_r), \quad (4)$$

$$C_{bB}(d,\delta,L,A_r) = C_s(d,L,A_r)\sin(2\pi\delta/L - 2\pi/3) + C_0(d,L,A_r), \quad (5)$$

$$C_{bC}(d,\delta,L,A_r) = C_s(d,L,A_r)\sin(2\pi\delta/L + \pi/3) + C_0(d,L,A_r), \quad (6)$$

where $C_s(d,L,A_r)$ is the amplitude of the cyclic position-dependent capacitance and $C_0(d,L,A_r)$ is the position-independent capacitance term, which depend upon the spacing of the electrodes, the gap d, the group length L, and the total array area $A_r$. The above equations may be rewritten in terms of a position phase angle $\theta_p = 2\pi\delta/L$, which is a function of displacement $\delta$ of the first electrode array 126 relative to the second electrode array 129.

For example, when the plurality of second patterns 156 of the electrodes 146 of the second electrode array 129 are excited by voltages:

$$V_A = V_{ac} \cos(\theta_c + 2\pi/3) \sin(\omega t), \quad (7)$$

$$V_B = V_{ac} \cos(\theta_c) \sin(\omega t), \text{ and} \quad (8)$$

$$V_C = V_{ac} \cos(\theta_c + 2\pi/3) \sin(\omega t), \quad (9)$$

where $\theta_c$ is the electrical phase angle, the demodulated output voltage, $V_p$, can be given by:

$$V_p = V_{ac} C_s(d,L,A_r) G_d \sin(\theta_p + 2\pi/3)\cos(\theta_c + 2\pi/3) + V_{ac} C_s(d,L,A_r) G_d \sin(\theta_p)\cos(\theta_c) + V_{ac} C_s(d,L,A_r) G_d \sin(\theta_p - 2\pi/3)\cos(\theta_c - 2\pi/3) \quad (10)$$

where $G_d$ is the gain of the differential integrator 220 and the synchronous demodulator 230 in Volts/Farad. The effect of variations in the position phase angle ($\theta_p$) and/or the electrical phase angle ($\theta_c$) on the demodulated output voltage ($V_p$) is illustrated in FIGS. 6 and 7.

Figure 6:
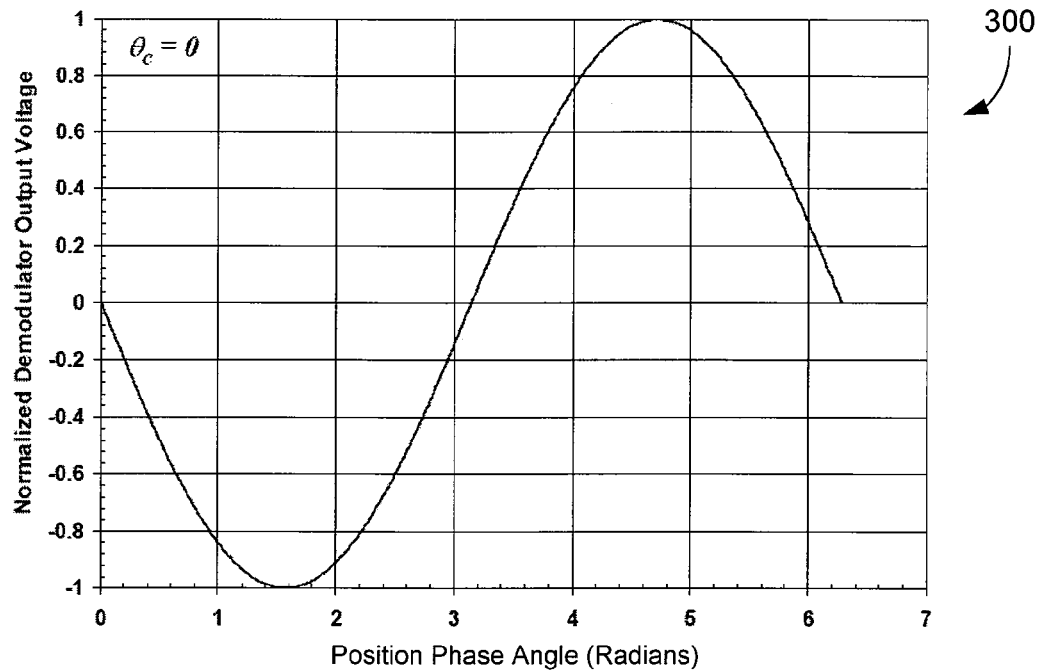
FIGS. 6 and 7 are graphical representations of variations in the demodulated output voltage of FIG. 5 according to embodiments of the present invention.

FIG. 6 is a graphical representation 300 of a normalized demodulated output voltage as the position phase angle varies from zero to $2\pi$ radians, when the electrical phase angle equals zero ($\theta_c = 0$). For any given position of the proof mass 119, there exist electrical null positions where the demodulated output voltage is zero. As illustrated in FIG. 6, an electrical null position for the first electrode array is located at $\theta_p = 0$ and at intervals of $\pm n\pi$, where n=1, 2, 3 .... As predicted by equation (10), displacement ($\delta$) of the first electrode array 126 relative to the second electrode array 129 causes the normalized demodulated output voltage to vary sinusoidally over the group length (L). The electrical null positions can be found for a reference position by varying the supplied voltages $V_A$, $V_B$, and $V_C$ to electrically sweep the electrical phase angle and monitoring the demodulated output voltage.

Figure 7:
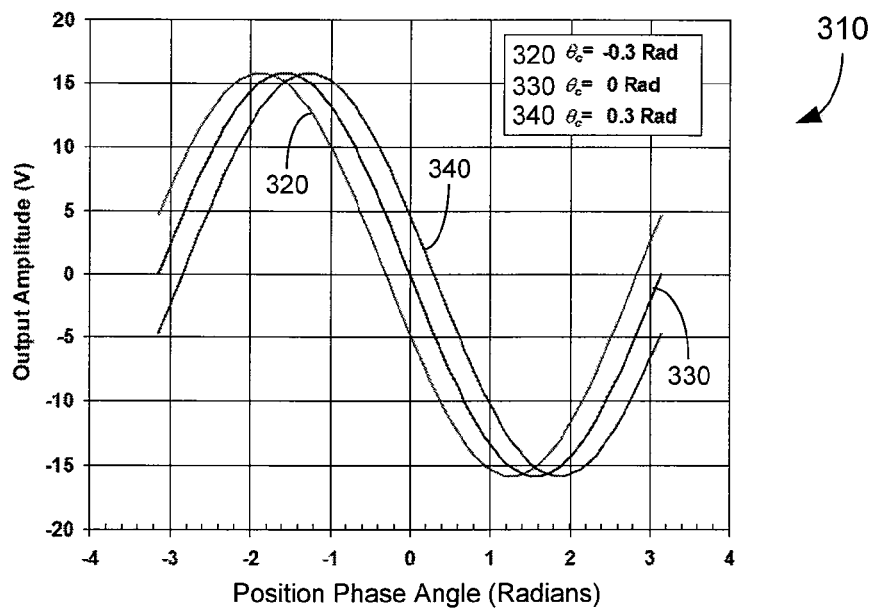

FIG. 7 is another graphical representation 310 of a demodulated output voltage as the position phase angle varies from $-\pi$ to $+\pi$ radians, with the electrical phase angle adjusted to $\theta_c = 0$ and $\pm 0.3$ radians. As illustrated by curve 330 of FIG. 7, the demodulated output voltage varies sinusoidally about the electrical null located at $\theta_p = 0$ when $\theta_c = 0$. By adjusting $\theta_c$ in equation (10), the electrical null position may be shifted left or right by adjusting $\theta_c$. As illustrated by curve 320 of FIG. 7, the electrical null position can be shifted to the left to correspond with a position phase angle of −0.3 radians. This shift in the electrical null position can be accomplished by adjusting the amplitudes of the voltages ($V_A$, $V_B$, and $V_C$) supplied to the second electrode array 129 in accordance with equations (7-9). By setting $\theta_c$ to the desired electrical null position (e.g., $\theta_c$=−0.3 radians), the voltage amplitudes for producing the shift can be determined. Similarly, as illustrated by curve 340 of FIG. 7, the electrical null position can be shifted to the left to correspond with a position phase angle of +0.3 radians by adjusting the voltages ($V_A$, $V_B$, and $V_C$) supplied to the second electrode array 129 in accordance with equations (7-9).

This ability to electrically adjust the null position allows for adjustment of misalignment between the first and second electrode arrays caused by relaxed wafer-to-wafer bonding alignment. Further, if this adjustment is done dynamically, the position of the first electrode array 126 relative to the second electrode array 129, and thus the position of the proof mass 119 relative to the support structure, may be tracked over an arbitrary dynamic range limited only by the size of the electrode arrays 126 and 129. Some embodiments described in the present disclosure can improve the dynamic range from present limits near 140 dB to values approaching 200 dB. In addition, a high degree of accuracy can be maintained for the displacement throughout the dynamic range. Some exemplary embodiments can enable improvement in position resolution to <10 fm and acceleration resolution below 1 nG.

Figure 8:
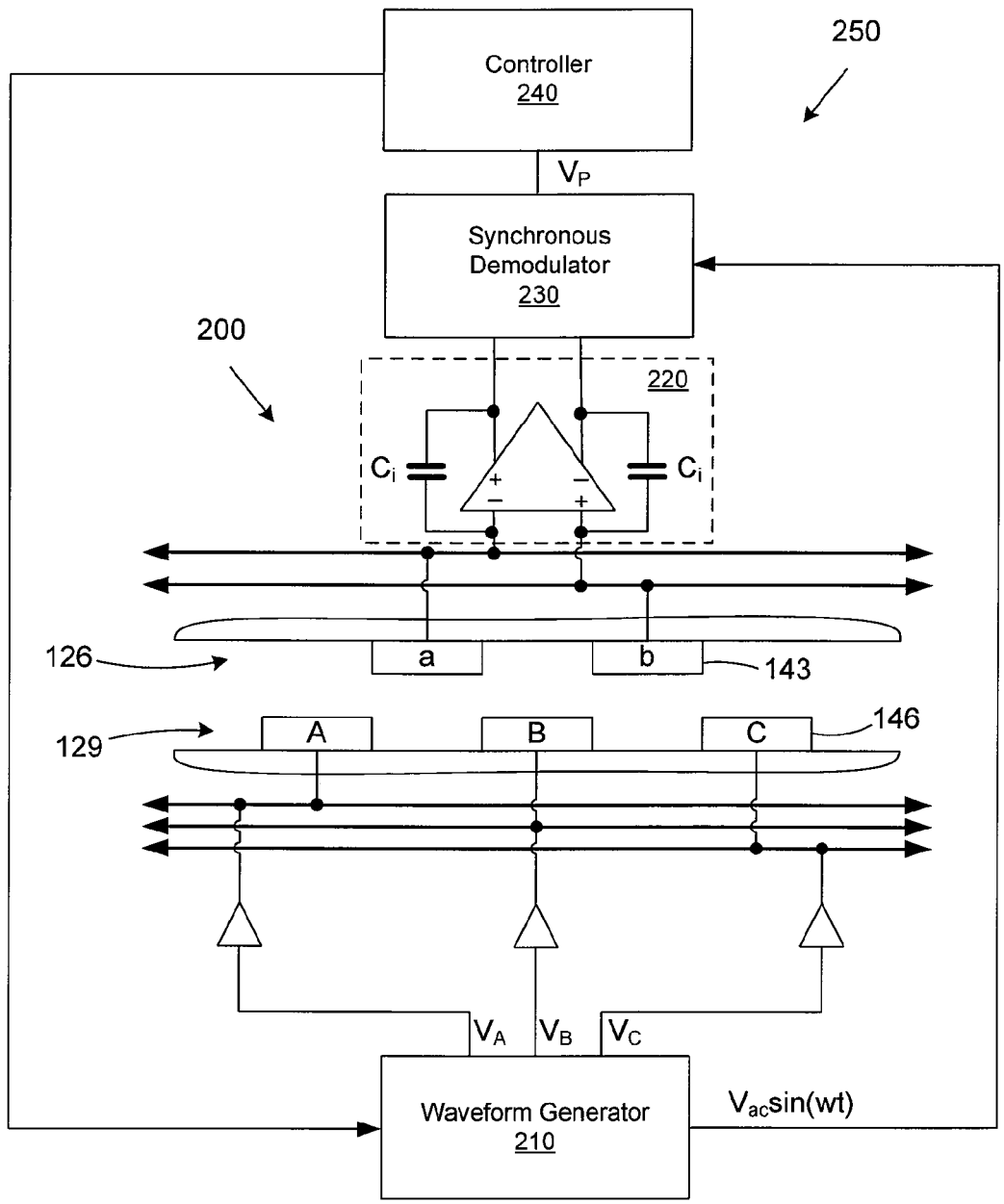
FIG. 8 is a schematic of the sensor as depicted in FIG. 5 including a controller for feedback based upon the demodulated output voltage according to an embodiment of the present invention.

Referring next to FIG. 8, sensor 250 includes a controller 240, which is added to the sensor 200 of FIG. 5, to provide feedback signals for control of the amplitudes of the voltages ($V_A$, $V_B$, and $V_C$) supplied to the second electrode array 129. The update rate of the feedback signals should be fast enough to ensure that the differential integrator 220 operates within its linear output range. Thus, the electrical null position for the first electrode array can be updated or adjusted before the proof mass 119 moves more than ±π/2 radians from the original electrical null position. By providing feedback to force the differential integrator output to substantially zero (i.e., shifting the electrical null position as close as the DAC resolution allows) using adjustments to the electrical phase angle, the proof mass 119 position may be tracked over arbitrary displacements limited only by the size of electrode arrays 126 and 129.

Figure 9:
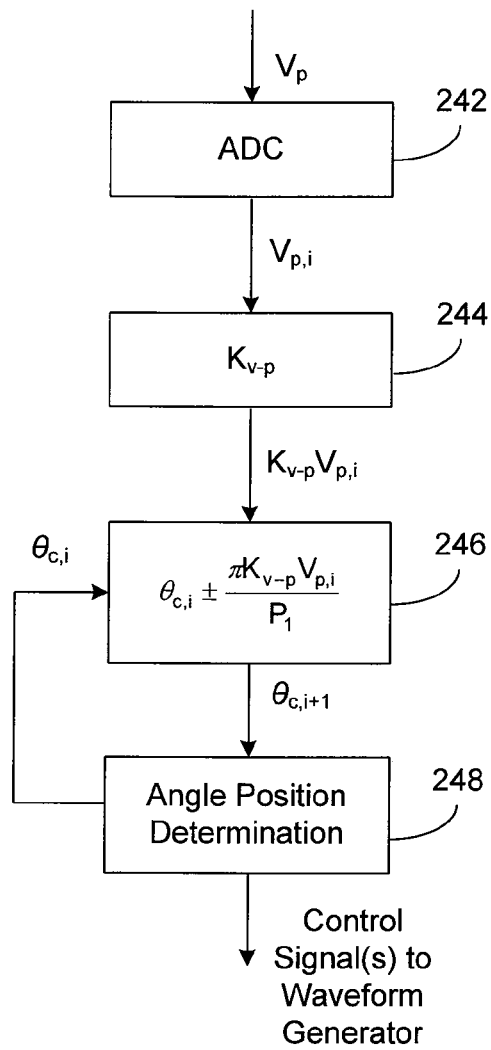
FIG. 9 illustrates the operation of an exemplary embodiment of the controller of FIG. 8 according to an embodiment of the present invention.

Referring to FIG. 9, the operation of an exemplary embodiment of controller 240 is illustrated. In the embodiment of FIG. 9, controller 240 is a digital controller. The demodulated output voltage ($V_p$) is sampled using an analog-to-digital converter (ADC) in block 242 to provide the i-th sample of the demodulated output voltage ($V_{p,i}$). By using a high enough sampling and update frequency, the variation in $V_p$ can be limited to utilize the full range and resolution of the ADC.

The demodulated output voltage is then converted to units of displacement in block 244 by scaling $V_{p,i}$ by $K_{v\text{-}p}$ (the gain of the differential integrator 220 and the synchronous demodulator 230 in units of displacement/Volt). For $V_{p,i}$, displacement of the first electrode array 126 relative to the second electrode array 129 at the time of the i-th sample can be given by:

$$\delta_i = \frac{\theta_{c,i} \times P_1}{\pi} + K_{v\text{-}p} V_{p,i}, \quad (11)$$

where $P_1$ is the pitch of the first electrode array 126 and $\theta_{c,i}$ is the i-th sample of the electrical phase angle (i.e., the electrical null position). Accordingly, the position of the proof mass 119 may be determined based upon the displacement $\delta_i$ from a reference position (e.g., $\theta_p$=0). In addition, acceleration can be determined by scaling the total displacement from the reference position by the displacement/acceleration input (dx/da) of the sensor. Acceleration may be given by:

$$A_i = \frac{\delta_i}{dx/da}. \quad (12)$$

The converted demodulated output ($K_{v\text{-}p} V_{p,i}$) is used in block 246 to determine the next electrical phase angle ($\theta_{c,i+1}$) based upon the based upon the previous electrical phase angle ($\theta_{c,i}$) at the time of the i-th sample:

$$\theta_{c,i+1} = \theta_{c,i} \pm \frac{\pi K_{v\text{-}p} V_{p,i}}{P_1}. \quad (13)$$

The sign of the feedback term determines whether the tracked electrical null position (i.e., the zero crossing) has either a positive or a negative slope. For a positive feedback term, the servo will lock to a positive slope crossing and to a negative slope crossing for a negative feedback term. The next electrical phase angle $\theta_{c,i+1}$ may then be utilized in block 248 to determine the updated electrical angle position and supply an output to the waveform generator 210. The next electrical phase angle may be used to shift the electrical null position before the next sample of the demodulated output voltage.

Figure 10:
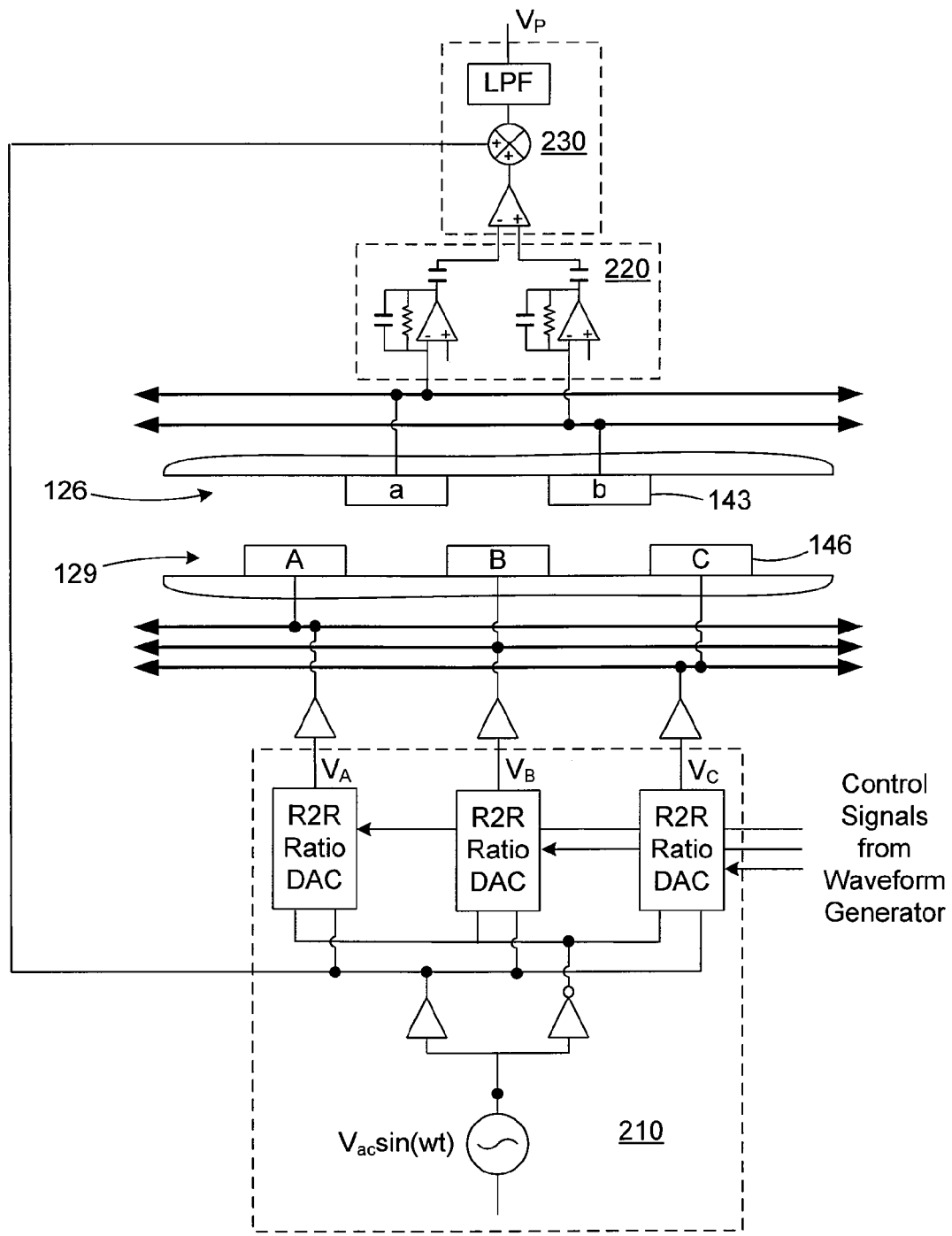
FIG. 10 is a schematic of exemplary embodiment of the sensor depicted in FIG. 8 according to an embodiment of the present invention.

For example, referring to FIG. 10, voltages $V_A$, $V_B$, and $V_C$ supplied to the second electrode array 129 through the R2R ratio DACs may have a limited resolution. For example, in one embodiment, the R2R ratio DAC output is limited to 12-bit resolution. As such, with 12-bit resolution, voltages $V_A$, $V_B$, and $V_C$ can be provided in 4096 discrete steps or values. In one embodiment, the next electrical phase angle $\theta_{c,i+1}$ is used to determine the control inputs for the R2R ratio DACs of FIG. 10 by using a lookup table. In this example, the next electrical phase angle corresponds to a table entry for each of the R2R ratio DACs. The table entries correspond to a 12-bit control signal that is sent by the controller 240 to each of the R2R ratio DACs. Accordingly, in this exemplary embodiment, only 4096 discrete electrical phase angle positions are possible using 12-bit resolution.

Referring back to FIG. 10, once the R2R ratio DACs update the electrical phase angle position based upon the control signals from controller 240, the demodulated output voltage ($V_p$) adjusts and the next sample of the demodulated output voltage ($V_{p,i+1}$) is taken. As previously described, $V_{p,i+1}$ and $\theta_{c,i+1}$ are used in block 246 to again determine the next electrical phase angle.

Figure 11:
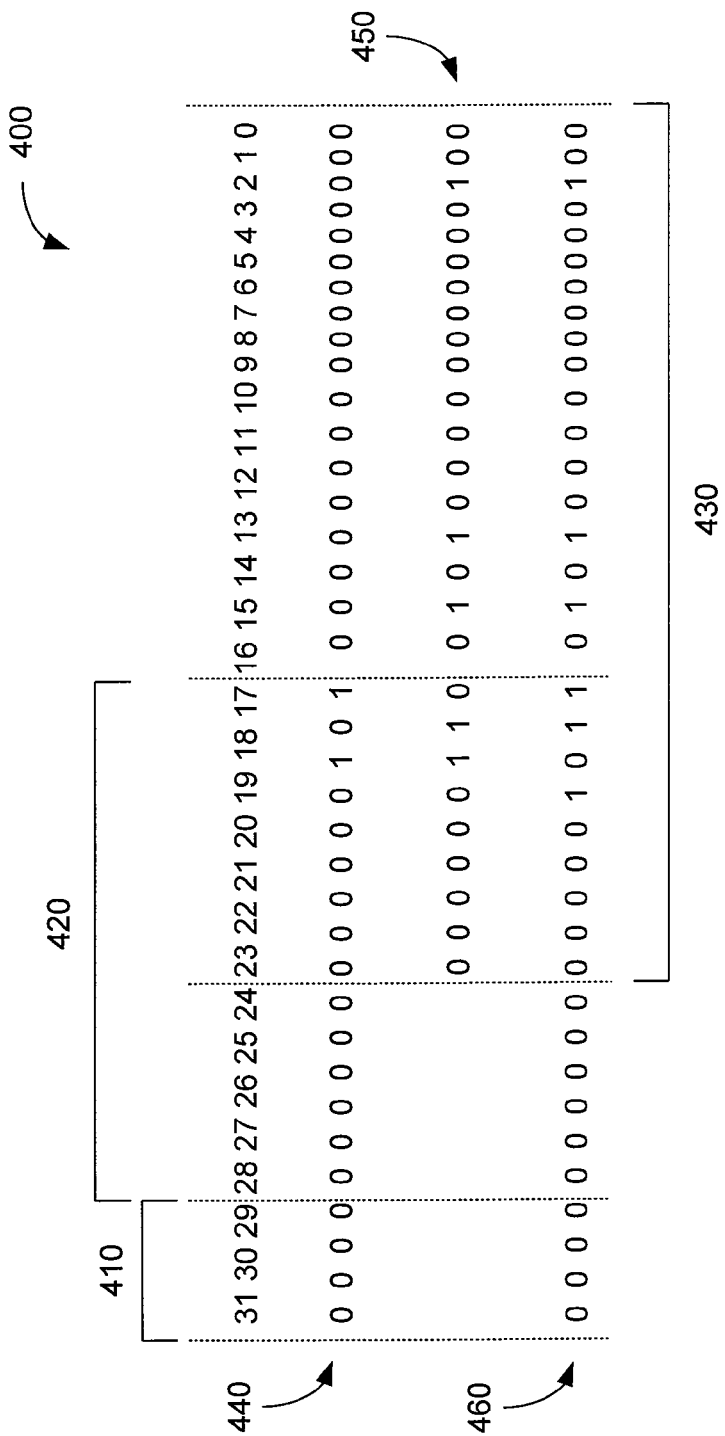
FIG. 11 illustrates an exemplary 32-bit position word used by the controller of FIG. 9 according to an embodiment of the present invention.

Resolution of the position determination can be illustrated using the 32-bit position word 400 of FIG. 11. If the three most significant bits 410 (bits 29-31) are used to indicated a cycle count, where one cycle is a deviation of one group length (L), then the remaining 29 bits can be used to indicate a deviation of less than one cycle (or group length). As such, the least significant bit (LSB) has a resolution of $2^{-29}$ times the group length.

The deviation of the proof mass 119 from a reference position may be determined based upon the position word 400. The cycle count 410 indicates the number of group lengths that have been moved and the remaining 29 bits indicate any remaining deviation of less that a full cycle. The value of the 29 LSBs can be determined from the electrical phase angle $\theta_{c,i}$ and the converted demodulated output ($K_{v\text{-}p}V_{p,i}$). In the case where voltages $V_A$, $V_B$, and $V_C$ are provided with 12-bit by the R2R ratio DACs of FIG. 10, then bits 17-28 (420) of the position word 400 correspond to the 12-bit control signal for the electrical phase angle (i.e., the position of the electrical null). Because of the 12-bit control of the R2R ratio DACs, the 17 LSBs (0-16) of the position word are zero.

The position can be further refined by adjusting for the deviation from the electrical null position based on the converted demodulated output ($K_{v\text{-}p}V_{p,i}$). If a 24-bit ADC is used to sample the demodulated output voltage ($V_p$), then $K_{v\text{-}p}V_{p,i}$ can be used to adjust up to 24 LSBs 430 (bits 0-23) of the position word 400. As can be seen in FIG. 11, there is a 7-bit overlap between the 24-bit converted demodulated output 430 and the 12-bit electrical phase angle position 420. Thus, if the sample rate is sufficiently high to allow updating of the electrical null position before a displacement of less than ±0.1 radian occurs and the 24-bit ADC is adjusted to sample the voltage variation of $V_p$ over a displacement range of larger than ±0.1 radian, then the position of the proof mass 119 may be determined with 29-bit accuracy within one full cycle or group length.

For example, let position word 440 represent the current position of the electrical phase angle $\theta_{c,i}$ (i.e., the electrical null position). In this example, the deviation from the reference position is less than one cycle. The electrical null position is indicated by bits 17-28 (420) and the 17 LSBs (bits 0-16) are set to zero. The demodulated output voltage ($V_p$) corresponding to the deviation from the electrical null position is measured and converted to the equivalent displacement $K_{v\text{-}p}V_{p,i}$, which is indicated by 450. Based upon the slope of $V_p$ about the electrical null position, displacement $K_{v\text{-}p}V_{p,i}$ 450 may be combined with the current null position 440 to determine the current position (word 460) of the first electrode array 126 relative to the second electrode array 129 (or the current displacement of the proof mass 119). Bits 17-28 (420) of position word 460 may then be used to update the electrical angle position $\theta_{c,i+1}$ to shift the electrical null position before the next sample of $V_p$. As can be understood from this example, variations in the bit resolution of the ADC of FIG. 9 and the R2R ratio DACs of FIG. 10 can allow for improved position resolution and variations in sampling and update rates, however, it should be noted that the position scale factors should be matched between the two measurement subsystems.

Figure 12:
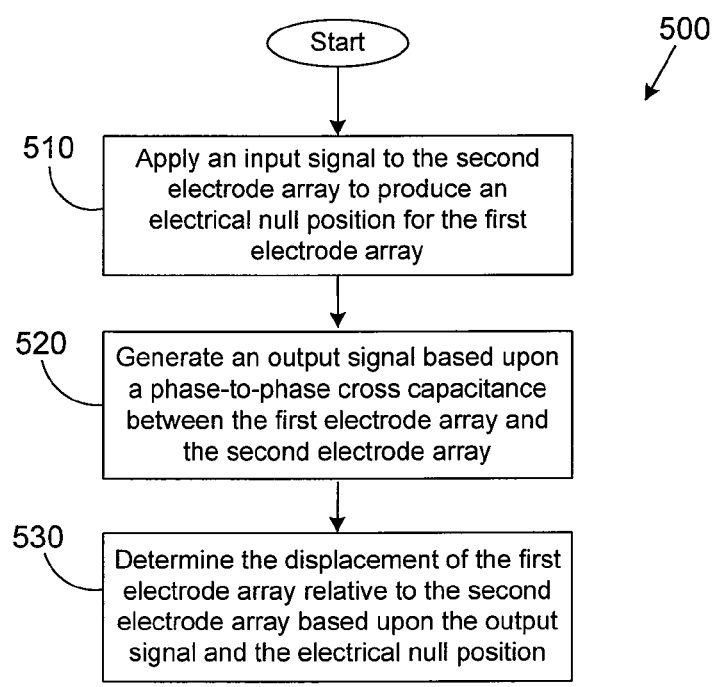
FIG. 12 is a flow chart that illustrates a method for determining the displacement of a second electrode array relative to a first electrode array of a sensor as depicted in FIG. 8 according to an embodiment of the present invention.

Referring next to FIG. 12, shown is a flow chart 500 that provides one example of a method for sensing acceleration using a sensor having a first electrode array disposed on a proof mass and a second electrode array disposed on a planar surface of a support structure as depicted in FIG. 8 according to an embodiment of the present invention. Alternatively, the flow chart 500 of FIG. 12 may be viewed as depicting steps of a sensor 250 (FIG. 8) to determine the displacement of a second electrode array relative to a first electrode array. The functionality of the sensor 250 as depicted by the example flow chart of FIG. 12 may be implemented in terms of software, hardware, or a combination of software and hardware as can be appreciated.

To begin, in block 510, an input signal is applied to the second electrode array to produce an electrical null position for the first electrode array. In the exemplary embodiment of FIG. 8, this may be accomplished by the waveform generator 210. Thereafter, an output signal is generated, in block 520, based upon a phase-to-phase cross capacitance between the first electrode array and the second electrode array. The output signal corresponds to a displacement of the first electrode array relative to the electrical null position. In block 530, the displacement of the first electrode array relative to the second electrode array based upon the output signal and the electrical null position. The displacement may be used to determine the acceleration of the sensor. In one embodiment, the position change can be scaled to an acceleration as $a_i = \delta_i/(dx/da)$, where $\delta_i$ is referenced to the zero acceleration position. In addition, the displacement may be used to shift the electrical null position for improved position sensing.

Although in one embodiment the sensor 250 may be embodied in software or code executed by general purpose hardware such as a digital processor as discussed above, as an alternative the same may also be embodied in dedicated hardware or a combination of software/general purpose hardware and dedicated hardware. If embodied in dedicated hardware, the sensor can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow charts of FIGS. 9 and 12 show the architecture, functionality, and operation of implementations of the sensor 250. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flow charts of FIGS. 9 and 12 show specific orders of execution, it is understood that the order of execution may differ from that which is depicted. For example, the order of execution of two or more blocks may be scrambled relative to the order shown. Also, two or more blocks shown in succession in FIGS. 9 and 12 may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present invention.

Also, where the sensor 250 comprises software or code, it can be embodied in any computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present invention, a "computer-readable medium" can be any medium that can contain, store, or maintain the sensor 250 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

In addition, the systems and methods described above for quantifying capacitance variation are termed "analog" approaches and operate in the frequency domain. However, switch-capacitor techniques applied in the time domain typically, referred to as "digital" approaches may also be employed. In particular, rather than use the analog source voltage $V_{ac}$ sin($\omega$t), digital excitation signals may be employed as can be appreciated.

Therefore, having thus described the invention, at least the following is claimed:

1. A sensor, comprising:
   a first electrode array disposed on a proof mass;
   a second electrode array disposed on a planar surface of a support structure;
   the proof mass attached to the support structure via a compliant coupling such that the first electrode array is positioned substantially parallel to and faces the second electrode array, wherein the proof mass is displaceable relative to the support structure, and wherein displacement of the proof mass is in a direction substantially parallel to the second electrode array;
   the first electrode array comprising a plurality of first patterns of electrodes, each of the first patterns comprising at least two first electrodes;
   the second electrode array comprising a plurality of second patterns of electrodes, each of the second patterns comprising at least three second electrodes, where corresponding ones of the second electrodes in the second patterns are coupled in common; and
   circuitry to provide an input voltage to each of the second patterns of electrodes to produce an electrical null position for the first electrode array.

2. The sensor of claim 1, wherein the input voltages all have a common reference frequency, each input voltage having an independently adjustable amplitude, where the electrical null position is to be shifted by adjusting the amplitudes for each input voltage.

3. The sensor of claim 1, further comprising circuitry to produce an output signal corresponding to a displacement of the first electrode array relative to the electrical null position.

4. The sensor of claim 3, wherein the circuitry to produce an output signal comprises:
   a differential integrator coupled to the plurality of first patterns of electrodes; and
   a synchronous demodulator coupled to the differential integrator, the synchronous demodulator to demodulate a reference frequency from the output signal.

5. The sensor of claim 3, further comprising circuitry to adjust the amplitudes for each input voltage to shift the electrical null position based on the output signal.

6. The sensor of claim 5, wherein the circuitry to adjust the amplitudes for each input voltage comprises a lookup table that provides updated amplitude values corresponding to each input voltage based in part upon the output signal.

7. The sensor of claim 6, wherein the updated amplitude values are digital control inputs corresponding to the adjusted amplitude for each input voltage.

8. The sensor of claim 3, further comprising circuitry to determine a position of the first electrode array relative to the second electrode array based on the output signal.

9. The sensor of claim 8, further comprising circuitry to determine acceleration of the proof mass based on the position of the first electrode array relative to the second electrode array.

10. The sensor of claim 1, wherein a ratio of a pitch of the first electrode array to a pitch of the second electrode array is substantially equal to 1.5.

11. A method for sensing acceleration using a sensor having a first electrode array disposed on a proof mass and a second electrode array disposed on a planar surface of a support structure, wherein the proof mass is attached to the support structure via a compliant coupling such that the first electrode array is positioned substantially parallel to and faces the second electrode array, wherein the proof mass is displaceable relative to the support structure, and wherein displacement of the proof mass is in a direction substantially parallel to the second electrode array, the method comprising the steps of:
   applying an input signal to the second electrode array to produce an electrical null position for the first electrode array, the second electrode array comprising a plurality of second patterns of electrodes, each of the second patterns comprising at least three second electrodes;
   generating an output signal based on a phase-to-phase cross capacitance between the first electrode array and the second electrode array, the first electrode array comprising a plurality of first patterns of electrodes, each of the first patterns comprising at least two first electrodes, wherein corresponding ones of the first electrodes in the first patterns are coupled in common, wherein the output signal corresponds to a displacement of the first electrode array relative to the electrical null position; and
   determining the displacement of the first electrode array relative to the second electrode array based on the output signal and the electrical null position.

12. The method of claim 11, wherein the input signal comprises input voltages for each of the second patterns of electrodes, the input voltages all having a common reference frequency, each input voltage having an independently adjustable amplitude, wherein the electrical null position is to be shifted by adjusting the amplitudes for each input voltage.

13. The method of claim 11, further comprising adjusting the amplitudes for each input voltage to shift the electrical null position based on the output signal.

14. The method of claim 13, wherein a lookup table is used to adjust the amplitudes for each input voltage by providing updated amplitude values corresponding to each input voltage based in part on the output signal.

15. The method of claim 11, further comprising determining acceleration of the proof mass based on the displacement of the first electrode array relative to the second electrode array.

* * * * *